United States Patent
Leinonen et al.

(10) Patent No.: US 6,563,883 B1
(45) Date of Patent: May 13, 2003

(54) TRANSMITTER

(75) Inventors: Marko Leinonen, Oulu (FI); Simo Kaleva, Kiiminki (FI); Heikki Mattila, Oulu (FI); Harri Lilja, Kimmontie (FI)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 09/320,768

(22) Filed: May 27, 1999

(30) Foreign Application Priority Data

May 27, 1998 (GB) ............................................. 9811382

(51) Int. Cl.[7] ............................................. H04L 27/20
(52) U.S. Cl. ...................................... 375/295; 375/146
(58) Field of Search ................................. 375/295, 135, 375/146, 297, 296; 455/126, 127

(56) References Cited

U.S. PATENT DOCUMENTS

| | | | |
|---|---|---|---|
| 4,878,030 A | * 10/1989 | Vincze ........................ 330/149 |
| 4,890,070 A | 12/1989 | Benahim et al. ............. 330/296 |
| 5,101,175 A | 3/1992 | Vaisanen ..................... 330/279 |
| 5,109,538 A | 4/1992 | Ikonen et al. ................... 455/89 |
| 5,118,965 A | 6/1992 | Vaisanen et al. ............. 307/261 |
| 5,152,004 A | 9/1992 | Vaisanen et al. ............... 455/68 |
| 5,164,884 A | 11/1992 | Pesola ........................ 361/386 |
| 5,204,643 A | 4/1993 | Verronen ................... 333/81 R |
| 5,214,309 A | 5/1993 | Saarnimo ..................... 257/712 |
| 5,214,372 A | 5/1993 | Vaisanen et al. ............... 324/95 |
| 5,230,091 A | 7/1993 | Vaisanen ..................... 455/88 |
| 5,241,694 A | 8/1993 | Vaisanen et al. ............. 455/126 |
| 5,257,257 A | 10/1993 | Chen et al. ..................... 370/18 |
| 5,276,917 A | 1/1994 | Vanhanen et al. ............. 455/89 |
| 5,291,147 A | 3/1994 | Muurinen ..................... 330/136 |
| 5,363,057 A | * 11/1994 | Furuno ........................ 330/129 |
| 5,392,464 A | 2/1995 | Pakonen ..................... 455/115 |
| 5,394,391 A | 2/1995 | Chen et al. ..................... 370/18 |
| 5,404,585 A | 4/1995 | Vimpari et al. ............. 455/115 |
| 5,416,435 A | 5/1995 | Jokinen et al. ............. 327/113 |
| 5,420,889 A | 5/1995 | Juntti ........................ 375/346 |
| 5,426,670 A | 6/1995 | Leppanen et al. ........... 375/343 |
| 5,432,473 A | 7/1995 | Mattila et al. ............... 330/133 |
| 5,434,537 A | 7/1995 | Kukkonen ..................... 330/2 |
| 5,440,597 A | 8/1995 | Chung et al. ................ 375/200 |
| 5,450,620 A | 9/1995 | Vaisanen ..................... 455/127 |
| 5,491,718 A | 2/1996 | Gould et al. ................. 375/205 |

(List continued on next page.)

FOREIGN PATENT DOCUMENTS

| | | |
|---|---|---|
| EP | 0 883 250 A2 | 12/1998 |
| EP | 0 977 354 A1 | 2/2000 |
| GB | 2 189 953 A | 11/1987 |
| GB | 2 326 782 A | 12/1998 |
| WO | WO 97/41642 | 11/1997 |

OTHER PUBLICATIONS

English Abstract of Japanese Patent Application No. JP9148852, Aihara Yuukichi.
United Kingdom Search Report.

*Primary Examiner*—Stephen Chin
*Assistant Examiner*—David B. Lugo
(74) *Attorney, Agent, or Firm*—Perman & Green, LLP

(57) ABSTRACT

A transmitter has an input for receiving a signal, gain controller for applying a first gain to the received signal, a first path for providing a second, relatively high gain for the received signal, a second path for providing a third, relatively low gain for said received signal, a transmitter for transmitting a signal and a controller to cause a received signal to pass through the gain controller and the first path when a relatively high gain is to be applied to the received signal and to cause a received signal to pass through the gain controller and the second path when a relatively low gain is to be applied to the received signal. When a change is made from using one of the first and second paths to using the other, the power of the signal transmitted by the transmitter varies by less than or equal to a predetermined amount.

30 Claims, 8 Drawing Sheets

U.S. PATENT DOCUMENTS

| | | | |
|---|---|---|---|
| 5,493,255 A | 2/1996 | Murtojarvi | 330/296 |
| 5,530,923 A | 6/1996 | Heinonen et al. | 455/126 |
| 5,533,013 A | 7/1996 | Leppanen | 370/18 |
| 5,548,616 A | 8/1996 | Mucke et al. | 375/295 |
| 5,550,893 A | 8/1996 | Heidari | 379/59 |
| 5,564,074 A | 10/1996 | Juntti | 455/67.1 |
| 5,566,201 A | 10/1996 | Ostman | 375/200 |
| 5,589,795 A | 12/1996 | Latva-Aho | 327/553 |
| 5,590,160 A | 12/1996 | Ostman | 375/367 |
| 5,596,571 A | 1/1997 | Gould et al. | 370/335 |
| 5,654,980 A | 8/1997 | Lava-aho et al. | 375/208 |
| 5,661,434 A | 8/1997 | Brozovich et al. | 330/51 |
| 5,675,611 A | 10/1997 | Lehtinen et al. | 375/297 |
| 5,697,074 A | 12/1997 | Makikallio et al. | 455/126 |
| 5,703,873 A | 12/1997 | Ojanpera et al. | 370/332 |
| 5,715,279 A | 2/1998 | Laakso et al. | 375/224 |
| 5,745,016 A | 4/1998 | Salminen | 333/17.1 |
| 5,752,172 A | 5/1998 | Matero | 455/127 |
| 5,786,728 A | 7/1998 | Alinikula | 330/149 |
| 5,815,801 A | 9/1998 | Hamalainen et al. | 455/63 |
| 5,819,165 A | 10/1998 | Hulkko et al. | 455/126 |
| 5,881,097 A | 3/1999 | Lilleberg et al. | 375/203 |
| 5,884,149 A | 3/1999 | Jaakola et al. | 455/103 |
| 5,887,252 A | 3/1999 | Noneman | 455/414 |
| 5,905,946 A | 5/1999 | Lilleberg et al. | 455/63 |
| 5,909,643 A | 6/1999 | Aihara | 455/127 |
| 6,240,279 B1 * | 5/2001 | Nitta et al. | 455/115 |
| 6,252,912 B1 * | 6/2001 | Salinger | 375/278 |

* cited by examiner

TRANSMITTER

FIELD OF THE INVENTION

The present invention relates to a transmitter and a method for gain control in a transmitter. In particularly, but not exclusively, the present invention relates to a transmitter and a method for gain control in a transmitter such as in a spread spectrum multiple access system using, for example code division multiple access (CDMA). The transmitter and method may be used in a cellular telecommunications network.

BACKGROUND TO THE INVENTION

FIG. 1 shows a known transmitter of a mobile station used in a cellular telecommunications network. The transmitter 1 comprises an antenna 2 which is used to receive and transmit signals. It should be appreciated that the transmit part only of the mobile station is shown in FIG. 1. The signal to be transmitted can be regarded in the illustrated transmitter 1 as being two signals, one of which is the sine component and the other of which is the cosine component. These compounds are alteratively referred to as the I and Q components. The I and Q components are initially at a baseband frequency. The I and Q signals are in digital form initially and are converted to analogue signals by respective digital to analogue convertors (DAC) 3a and 3b. The output of each of the digital to analogue converters 3a and 3b is connected to a respective lowpass filter 4a and 4b. The lowpass filters 4a and 4b filter out undesired components which are introduced by the digital to analogue converters 3a and 3b.

The output of each of the digital to analogue converters 4a and 4b are input to an IQ modulator 5. The IQ modulator 5 includes two mixers 5a and 5b which mix each of the I and Q signals with a signal from a first local oscillator 7 to provide resulting bandpass signals at an intermediate frequency. It should be noted that the signal which is mixed with the Q component is 90° out of phase with the signal which is mixed with the I component of the signal. This 90° phase delay is introduced by delay element 5c. The resulting I and Q signals which are now at the intermediate frequency are then summed by a summer 5d of the modulator 5 to provide a single bandpass signal.

The output of the summer 5d is input to a first amplifier 9 which amplifies the output of the summer 5d. The output of the first amplifier 9 is input to a first bandpass filter 11 which filters out any undesired components of the signal which have been introduced by the first amplifier 9. The output of the first bandpass filter 11 is input to a first gain control block 13 which applies a gain to the signal output by the first bandpass filter 11. The first gain control block 13 receives a control signal 13a which determines the amount of gain to be applied by the first gain control block 13.

The output of the first gain control block 13 is input into a mixer 6 which also receives an input from a second local oscillator 8. The output from the second local oscillator 8 is mixed with the output from the first gain control block 13 to provide an output signal which is at the radio frequency, i.e. the frequency at which the signal is to be transmitted by the antenna 2.

The output of the mixer 6 is input to a second bandpass filter 15 which filters out any undesired components introduced by the mixer 6. The output of the second bandpass filter 15 is input to a second amplifier 17 which amplifies the signal. The output of the second amplifier 17 is input to a second gain control block 10. The second gain control block 10 receives a control signal 12 which determines the gain to be applied to the signal. In particular, the second gain control block 10 varies the amount of gain applied to the input signal in dependence on the control signal 12. The output of the second gain control block 10 is input to a high power amplifier 14 which amplifies the signal by a fixed amount. The output of the high power amplifier 14 is output to the antenna 2 via a duplex filter 42.

However, it is often useful to be able to measure the power of the signal which is transmitted. Accordingly, a directional coupler 16 or similar device is provided. The coupler 16 allows a small proportion of the signal to be transmitted to be removed. The power level of that small proportion of the signal is measured using a radio frequency to DC rectifier 18, consisting of a diode and passive component(s). By suitable scaling, a voltage value indicative of the power level of the signal which is to be transmitted can be obtained.

The duplex filter 42 has a transmit portion 42b which is tuned to the radio frequency. The transmit portion 42b removes undesired components introduced by the transmissive chain. The receive frequency is different from the transmit frequency. The duplex filter 42 also has a receive portion 42a which is tuned to the receive frequency.

The signal to be transmitted may be either a speech or data transmission and may be a combination of the two, depending on the use being made of the transmitter. For convenience, any references hereinafter to the type of signal being transmitted will be termed speech mode and data mode of the transmitter. In speech mode, the required power of the transmitted signal may be relatively low, because the gain of CDMA systems is relatively high for low bit rate services. However, in data mode the required power of the transmitted signal may be relatively high, because the gain lowers when the user data rate is increased.

The transmitter 1 shown in FIG. 1 is not particularly suitable for a system which requires high power control accuracy and high power control dynamic range. One example of such kind of system is CDMA. This is because in a CDMA system, the mobile station transmitter will often operate at a relatively low power level. If the arrangement shown in FIG. 1 is used, the entire transmission chain, particularly the power amplifier, will still consume power even if the power level required for the transmitted signal is relatively low. This means that the average power consumption is high and the life of the battery between chargings is reduced.

Typically, in WCDMA systems, the information bit rate of the transmitted signal may be in the approximate range of 12.2 kbps for speech signals 144 kbps (or even up to 384 kbps) for data transmission.. It is understood that about 10.7 dB (10 log 144+12.2) less transmission power is needed for transmission at 12.2 kbps and for 144 kbps. This 10.7 dB difference in the power requirement decreases the efficiency of power amplifier in speech mode since the power efficiency of a power amplifier decreases at lower output powers.

Reference is now made to the arrangement shown in FIG. 2. FIG. 2 shows a transmitter 19 which is used for TDMA mobile stations and which is disclosed in U.S. Pat. No. 5,152,004. In the arrangement shown in FIG. 2, the signal which is to be transmitted and which is at the radio frequency is input to a power divider 20. The power divider 20 divides a signal into two parts. One part of the signal is input to an amplifier 22 whilst the other part of the signal is input to an attenuator 24. When a high power transmitted signal is required, the signal is amplified by the power amplifier 22 and output to the antenna 2. However, when the transmitted signal is to have low power, the power amplifier 22 is not used and the signal only passes through the attenuator 24 to provide a lower power signal. The lower power signal is output by the attenuator 24 to the antenna 2. Whilst power consumption is reduced, the transmitter 19 shown in FIG. 2 has the disadvantage that the output power level will not always have a smooth transition when a change is made from the path using the power amplifier 20 and the path using the attenuator 24. This is because the arrangement of U.S. Pat. No. 5,152,004 does not have any circuitry which can provide accurate and hence smooth power control when changes between the power amplifier and the attenuator paths take place. This gives rise to glitches (inaccuracies) in the power control of the signal to be transmitted which is disadvantageous.

The arrangement of U.S. Pat. No. 5,152,004 uses real time (analogue) feedback for the power control. Real time feedback is possible for narrowband systems (as TDMA usually is). However, for wideband systems (such as CDMA) analogue feedback would lead to problems, for example in stability. Thus non-real time (digital) feedback is preferred for wideband system (CDMA).

U.S. Pat. No. 5,661,434 (Fujitsu) discloses a transceiver for use in a wireless local area network which has two amplifiers connected in series. Where a lower level of amplification is required, one of the two amplifiers can be bypassed. This transceiver suffers from the same disadvantages as U.S. Pat. No. 5,152,004.

The signal which is modulated prior to transmission is generally modulated using a digital modulation method. When a linear (digital) modulation method (such as band limited QPSK) is used, if the transmitter is not linear, spectrum spreading to adjacent channels can occur. This can be a problem for CDMA systems. This leads to a reduction in the quality of the transmissions and can also reduce the system capacity. If the transmitter is linear or substantially linear, the problem of spectrum spreading to adjacent channels can be reduced. The linearity of the transmitter is largely dependent on the operating characteristics of the power amplifier. Highly linear power amplifiers could be used to reduce the amount of spectrum spreading to adjacent channels. However, the power efficiency of linear amplifiers is poor. Less linear amplifiers are more efficient and in particular consume less power for the required amplification. It has therefore been proposed to use nonlinear amplifiers but with compensation for the non-linearity of the amplifier.

One method of compensation is digital predistortion. With this method, before a signal is input to a power amplifier, it is predistorted in a nonlinear manner. This predistortion is the inverse of the distortion which is applied by the amplifier. Accordingly, the predistorted signal is input to the amplifier which provides a linear output. However, whilst this method provides improved power consumption if the signal is to be transmitted with a relatively high power level, the power efficiency is lower when the signal is transmitted with a lower power level. This is because the predistortion part of the transmitter consumes the same amount of power regardless of the power level of the signal to be transmitted. Since CDMA mobile stations will tend to use lower power levels, there may be little power saving as compared to simply using a linear power amplifier.

SUMMARY OF THE INVENTION

It is an aim of certain embodiments of the present invention to provide a transmitter which makes more efficient use of power and which avoids glitches in the power level of the signal to be transmitted.

According to a first aspect of the present invention, there is provided a transmitter comprising: an input for receiving a signal; gain control means for applying a first gain to the received signal; first path means for providing a second, relatively high gain for said received signal; second path means for providing a third, relatively high low gain for said received signal; transmitter means for transmitting a signal; and control means operable in use, to cause a received signal to pass through the gain control means and said first path means when a relatively high gain is to be applied to the received signal and to cause a received signal to pass through the gain control means and said second path means when a relatively low gain is to be applied to said received signal, wherein when a change is made from using one of said first and second path means to using the others of said first and second path means, the power of the signal transmitted by the transmitter varies by less than or equal to a predetermined amount.

It is possible to ensure that the power of a signal transmitted by the transmitter means remains substantially the same or only varies by a small amount. The glitches which would occur with the prior art arrangements can be avoided. The power of the signal transmitted may be identical before and after making a transition between the first and second path means or there may be a difference in the power level before and after making such a transition. This difference may be relatively small. The output power of the transmitter means is preferably monotonic, particularly when the power level is generally increasing or generally decreasing.

Embodiments of the present invention are particularly applicable to transmitters which have a high dynamic power range and small power control step size. The power step size is preferably equal to the predetermined amount. For example, the step size may be 1 dB.

Measuring means may be provided to provide a value indicative of the value of the power level of the signal to be transmitted by the transmitting means. The measuring means may take any suitable form and may for example be provided by a combination of coupling means and power measuring means.

The measuring means may provide a reference voltage value when a signal passes through the second path means and gain of the gain control means has been set at a predetermined level, and the control means, when the measuring means provides the reference value when a signal passes through the first path means, causes a received signal to pass through the second path means. The predetermined gain level may be the maximum gain of the gain control means.

When the change is made so that a received signal passes through the second path means, the gain of the gain control means may be set to the predetermined gain level. This may ensure that the power level of the output signal remains the same or of a similar value when a transition is made from the first path means to the second path means.

Preferably, when the measuring means provides a predetermined value when a received signal passes through the second path means, the control means causes a received signal to pass through the first path means. This may occur in a tuning mode of operation. Preferably, when a signal passes through said first path means and the measuring means provides the predetermined value, the corresponding gain value defines a reference gain value. Preferably, the gain of the gain control means is set at the reference gain value when the control means causes a received signal to change to the first path means.

The predetermined value of the measuring means is preferably the same as the reference value of the measuring means.

Preferably, when the control means subsequently cause a change from the first path means to the second path means, the gain value of the gain control means which causes a received signal passing through the first path means to provide the predetermined value at the measuring means is stored as a new reference gain value. A new gain reference value may be stored each time there is a change from the first path means to the second path means.

Preferably, when the control means subsequently causes the change from the second path means to the first path means, the value of the measuring means caused by a received signal passing through the second path means when the gain of the gain control means is at the predetermined level is stored as a new reference value. Again, it is preferable that the reference value be updated each time there is a change from the second path means to the first path means.

Preferably, a temperature sensor is provided and the control means is arranged to compensate the reference gain value for variations in the temperature. Preferably, a temperature sensor is provided and the control means is arranged to compensate the reference value of the measuring means for variations in temperature.

The gain of the first and/or second path means are preferably constant. Thus, the variation in the output power level of the signal can be simply controlled by the gain control means. However, the gain of the first and/or second path means may be variable.

Preferably, the power level of the signal transmitted by the transmitter is increased or decreased by a predetermined amount when changing between the first and second path means. For example, in a typical CDMA system, this may be of the order of 1 dB.

The first path means may comprise amplifier means for amplifying a received signal. Predistortion means may be provided for predistorting a received signal prior to the signal passing through said amplifier means, whereby said predistortion means is arranged to substantially compensate for non-linearity of said amplifier means, the control means being arranged if the power level of the signal to be transmitted by the transmitter means is below a predetermined level, the signal does not pass through said predistortion means and if the power level of the signal to be transmitted by the transmitter means is above a predetermined level said received signal passes through said predistortion means and said amplifier means. When digital predistortion is not used, the second path may be used.

Thus, the predistortion means is only used when the power level of the transmitted signal is relatively high and the non-linearity of the amplifier means is most likely to cause problems. The predistortion means thus compensates for the nonlinear characteristics of the amplifier means. If the amplifier means are nonlinear, more efficient use of power can be achieved. However, when the power level falls below a predetermined level, the predistortion means are not used, thus saving the power required to operate the predistortion means.

Preferably, bias control means are provided for controlling the biassing applied to the amplifier means, whereby when the power level of the signal to be transmitted by the transmitting means is above the predetermined level, then the amplifier means is controlled by the bias control means to operate non-linearly. This gets the maximum power efficiency out of the transmitter even allowing for the extra power consumption required by the predistortion means.

If the power level of the signal to be transmitted by said transmitter is below the predetermined level, the amplifier means are controlled by the bias control means to operate substantially linearly. Thus, the signal may pass through the amplifier which as it is controlled to operate in a linear fashion, gives a linear output. However, in some embodiments of the present invention, the bias voltage applied to the amplifier may be only to avoid significant temperature changes in the amplifier means between the amplifier means being last used prior to the switching to the bypass path and being next used.

The first path may comprise a plurality of amplifiers arranged in series; and the second path bypasses at least one of said plurality of amplifiers.

In this arrangement, a plurality of amplifiers are connected in series at least some of which are bypassed. For example, if three amplifiers are provided, one or two amplifiers could be bypassed to provide the second path whilst all three amplifiers could be bypassed to provide a third path. This arrangement has the advantage that more power consumption savings and increased power control range can be achieved. The number of amplifier stages which a signal passes through can thus be controlled.

Preferably, the transmitter which may be a radio frequency transmitter described hereinbefore can be included in the mobile station. The mobile station may be arranged to work in a spread spectrum communications system. That spread spectrum communications system may use code division multiple access.

According to a second aspect of the present invention, there is provided a method for controlling gain of a transmitted signal comprising the steps of: receiving an input signal; applying a first gain to the input signal; causing a received signal to pass through a first path providing a second, relatively high, gain when a relatively high gain signal is required and causing a received signal to pass through second path means providing a third, relatively low, gain when a relatively low gain is required; and controlling the gain applied to the input signal so that when a change is made using one of the first and second paths to using the other of said first and second paths, the power of the transmitted signal varies by less than or equal to a predetermined amount.

According to a third aspect of the present invention, there is provided a transmitter comprising an input for receiving a signal; first path means for providing a first, relatively high gain for said received signal; second path means for providing a second, relatively low gain for said received signals; and transmitter means for transmitting a signal, wherein said received signal comprises speech signals or data signals or a combination of speech and data signals.

Preferably the content of the received signal may include either a speech signal, a data signal, or a combination of speech and data signals.

BRIEF DESCRIPTION OF THE DRAWINGS

For a better understanding of the present invention and as to how the same may be carried into effect, reference will now be made by way of example to the accompanying drawings in which.

DETAILED DESCRIPTION OF PREFERRED EMBODIMENTS OF THE INVENTION

Figure 1:
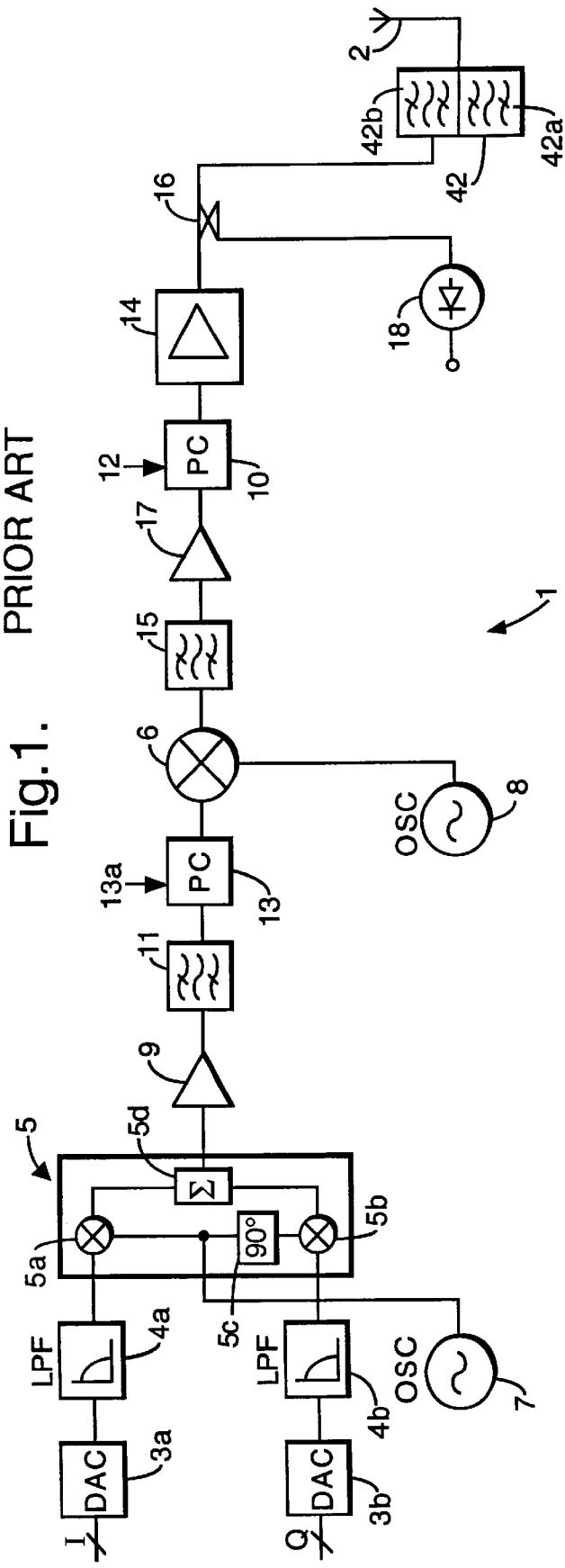
FIG. 1 shows a first known transmitter.
Figure 2:
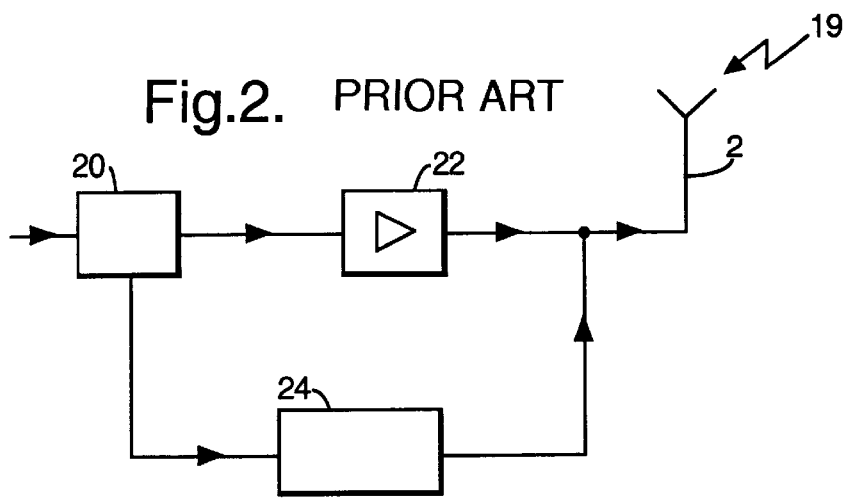
FIG. 2 shows a second known transmitter.
Figure 3:
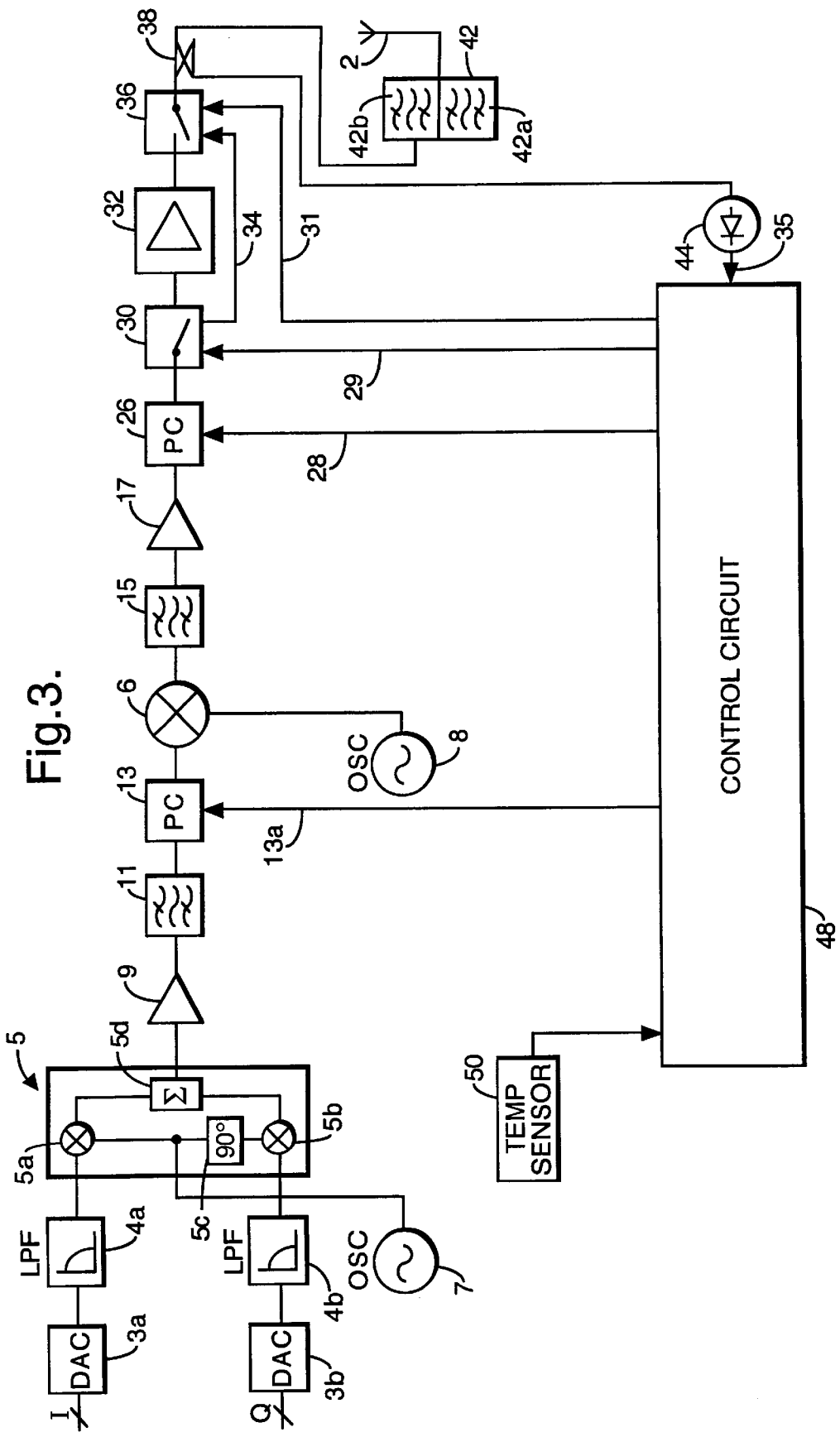
FIG. 3 shows a schematic view of a first transmitter embodying the present invention.

Reference will now be made to FIG. 3 which shows a first embodiment of the present invention. In particular, FIG. 3 shows a transmitter for a CDMA mobile station. Those elements which are the same as those shown in FIG. 1 are referred to by the same reference numerals.

The I and Q signals are converted by the respective digital to analogue converters 3a and 3b to digital signals. These digital signals are filtered by the respective low pass filters 4a and 4b. The output of the lowpass filters 4a and 4b are mixed with the signal from the first local oscillator 7 to provide signals at the intermediate frequency and combined by the summer 5d of the IQ modulator 5. As with the arrangement shown in FIG. 1 the signal from the first local oscillator combined with the Q signal is 90° out of phase with respect to the signal combined with the I signal by virtue of delay element 5c. The combined signal output from the modulator 5 is input to the first amplifier 9 where the signal is amplified. The output of the first amplifier 9 is filtered by the first bandpass filter 11. The output of the first bandpass filter 11 is input to the gain control block 13 which applies a gain or attenuation to the signal in accordance with a control signal 13a from a control circuit 48. In other words the gain applied can be a positive or negative gain.

The output of the gain control block 13 is applied to the mixer 6 where the modulated signal is mixed with the signal from the second local oscillator 8 to provide an output which represents the signal at the radio frequency. The output of the mixer 6 is input to the second bandpass filter 15 where the signal is filtered. The filtered signal is input to the second amplifier which amplifies the signal. The output of the second amplifier 17 is input to a second gain control block 26 which is arranged to receive a control signal 28 from the control circuit 48. The second gain control block 26 of FIG. 3 differs from that of FIG. 1 in its operation, as will be described in more detail hereinafter.

The output of the gain control block 26 is input to a first switch 30. In one position, the first switch 30 will connect the output of the gain control block 26 to the input of a high power amplifier 32. It should be appreciated that the power amplifier can be replaced by several amplifiers in series. The amplification of the power amplifier 32 is preferably but not necessarily fixed. When the first switch 30 is in its second position, it will connect the output of the gain control block 26 to a bypass path 34. The bypass path 34 may provide no gain, attenuation or a small degree of amplification, less than that provided by the power amplifier 32.

A second switch 36 is arranged to connect a coupler 38 to the output of the power amplifier 30 or the bypass path 34. The position of the second switch 36 will depend on the position of the first switch 30. Thus when the first switch 30 causes the output of the second gain control block 26 to be input to the power amplifier 32, the second switch 36 will connect to the output of the power amplifier 32 to the coupler 38. When the first switch 30 connects the output of the second gain control block 26 to the bypass path 34, the other end of the bypass path 34 will be connected, via the second switch 36, to the coupler 38.

In the embodiment shown in FIG. 3, the output of the coupler 38 is connected to the duplex filter 42. The duplex filter 42 comprises two portions. The first portion is the receive filter portion 42a which is tuned to the frequency of the signal to be received by the antenna 2. The second portion of the duplex filter 42 is the transmit filter portion 42b which is tuned to the radio frequency of the signal to be transmitted by the antenna 2.

The second output of the coupler 38 is connected to a RF to DC rectifier 44. As with the arrangement of FIG. 1, the first coupler 38 allows a small proportion of the signal to be transmitted to be fed to the RF to DC rectifier 44 so that, after suitable scaling (not shown), a voltage indicative of the power of the signal to be transmitted can be obtained. The output of the RF to DC rectifier 44 will be referred to as Vdet.

A control circuit 48, which may be a digital signal processor (DSP) or any other suitable digital or analogue control logic circuitry, is arranged to provide the control signal 28 which is used to set the gain of the gain control block 26 so that a desired power level for the signal to be transmitted can be achieved. The desired power level may be based on a number of different factors, for example the strength of a previously received signal etc. The control circuit 48 also is arranged to control the position of the first and second switches 30 and 36, via control signals 29 and 31 respectively. The control circuit 48 also receives the output Vdet of the RF to DC rectifier 44, via line 35. The control circuit 48 may carry out any necessary scaling of the output of the RF to DC rectifier 44.

The control of the embodiment shown in FIG. 3 will now be described. The embodiment shown in FIG. 3, when first used, is initialised. This initialisation can be carried out in the factory where the transceiver is made and/or can be carried out in a tuning mode of operation when the transceiver is actually used. The gain of the second gain control block 26 is set by the control signal 28 to the maximum value. The desired power level may also be determined according to the mode of operation of the transmitter i.e. speech mode and/or data mode. The output of the second gain control block 26 then passes through the bypass path 34. The control circuit 48 controls the first and second switches 30 and 36, via signals 29 and 31 respectively, to have the appropriate positions to allow the signal to pass through the bypass path 34. The output of the RF to DC rectifier 44 provides a reference voltage Vref which is stored by the control circuit 48. Thus, the reference value Vref corresponds to the power of the signal when the second gain control block 26 has maximum gain and the signal passes through the bypass switch 34. It is also possible that the second gain control block can be used for calibration.

Next, the control circuit 48 controls the first and second switches 30 and 36 so that the output of the second gain control block 26 is input to the power amplifier 32. The gain of the gain control block 26 is reduced by control signal 28 until the output of the RF to DC rectifier 44 is the same as Vref. The value of the gain required in these circumstances is stored as ILref and provides a reference gain for the second gain control block 26.

When the embodiment shown in FIG. 3 is controlled by the control circuit 48 so that the signal switches to passing through the power amplifier 32 instead of passing through the bypass switch 34, for example when the mode of operation of the transmitter changes from speech mode to data mode or if the power required for the existing mode increases, the following occurs. If a switch is made from the bypass path 34 to the power amplifier 32, the transmitted power may be increasing. Initially, the signal passes through the bypass switch 34. When the value of the gain of the second gain control block 26 has been increased so that the gain value IL is at its maximum, the output of the RF to DC rectifier 44 is stored as a new reference voltage value Vref. If the power level is to be increased further, the control block 48 controls the first and second switches 30 and 36 so that the output of the second gain control block 26 is input to the power amplifier 32. If the desired power level of the signal to be transmitted is increased, the gain of the second gain control block 26 will be ILref plus the power increment. In CDMA systems, the power level for successive transmissions may vary by 1 dB. Accordingly, the power increment may, in some embodiments, be 1 dB. It should be appreciated that a switch from the bypass path 34 to the power amplifier 32 can also take place even when the desired power level of the signal to be transmitted does not change. In those circumstances, the gain control value for the second gain control block 26 will be ILref, when the switch has been made from the bypass path 34 to the power amplifier 32 path.

When the power is generally decreasing, for example when changing from data mode to continue the transmission in speech mode only or if the power required for the existing mode decreases, a switch may be made from the path through the power amplifier 32 to the bypass path 34. Initially, the path will be through power amplifier 32. When the output of the RF to DC rectifier 44 is Vref (possibly after adjustment by the control circuit 48 as discussed hereinbefore), the control circuit 48 controls the first and second switches 30 and 36 to cause the output of the second gain control block 26 to pass through the bypass path 34. The gain control for the second gain control block 26 is then set by control signal 28 to the maximum gain IL minus the power decrement value i.e. 1 dB. If the change from the path through the power amplifier 32 to the bypass path 34 takes place when the output power has not changed or is not changing, the gain of the second gain control block 26 will be set just to the maximum gain value IL.

It should be noted that switching between the bypass path 34 and the power amplifier path 32 at the maximum gain value of the second gain control block 26 provides the transmission with the maximum dynamic range.

In practice, the operating conditions of the circuit shown in FIG. 3 will change over time so that the initially calculated value Vref and ILref may no longer be the correct values for these parameters. For example, the behaviour of the circuit shown in FIG. 3 may vary with temperature. Accordingly, a temperature sensor 50 may be provided. The output of temperature sensor 50 is connected to the control circuit 48. The control circuit 48 may include a look-up table which provides correction values for the ILref gain value in relation to temperature. Thus, as the temperature changes, the value of ILref will be updated.

For each temperature value, a corresponding value for the reference gain value ILref and the reference voltage Vref is stored. It should be noted that in practice, the output of the temperature sensor will be in analogue form and will be converted to digital form and the values stored for the temperature may not represent absolute values. Rather, the values stored in the table may represent relative values. The temperature dependent values of the gain IL are used to eliminate or reduce possible glitches when switching from the bypass path 34 to the power amplifier 32. These glitches may be caused by the gain of the power amplifier 32 drifting due to changes in temperature. The temperature dependent values of the reference voltage Vref are used to eliminate or reduce glitches which occur when switching from the power amplifier 32 to the bypass path 34. These glitches may occur as a result of drifts in the gain of the transmitter chain prior to the power amplifier 32, again due to changes in the temperature.

When a switch from the bypass path 34 to the power amplifier 32 is performed, the value read by the temperature sensor 50 is read. The ILref value, which corresponds to the read temperature value or a temperature value in the look up table which is closest to the read temperature value, is read from the look up table. This ILref value is then used as the new gain value when the change is made from the bypass path to the power amplifier. Alternatively if a sensed temperature value is not included in the look up table, a linear approximation or the like is used with the two ILref values corresponding to the temperature values in the look up table on either side of the sensed temperature value. The value of Vref is also updated. In particular, the sensed value of the voltage Vdet when the gain is at its maximum and the bypass path 34 is being used is stored as the new Vref value for the sensed temperature.

When switching from the power amplifier 32 to the bypass path 34, the temperature is sensed and when the voltage has the value of Vref corresponding to the sensed temperature a switch to the power amplifier path is made. The value of ILref is updated at the same time. In particular, the gain value power which occurs for the Vref values when the amplifier path is used, for the read temperature, will replace the value currently in the table. Similar methods to that outlined in respect of ILref can be used to obtain the required Vref value if the sensed temperature does not correspond exactly to any of the temperatures in the look up table.

In this way changes in characteristics of the transceiver over time can be compensated for in that the values of ILref and Vref will continually be updated.

Thus, the value of Vref for the detected temperature is updated each time a transition is made from the bypass path 34 to the power amplifier path 32. In particular, when the gain IL is at a maximum, the detected value Vdet (suitably adjusted by the control circuit 48 if necessary) will be stored as the new Vref value for the detected temperature. Additionally, ILref for the detected temperature is updated each time a transition is made from the power amplifier 32 path to the bypass switch 34. In particular, when Vdet is the same as the currently stored reference value Vref and the signal is passing through the bypass path 34, the current value of the gain is stored as ILref for the detected temperature.

The arrangement in FIG. 3 is usually such that the time between changes between the path through the power amplifier 32 and the bypass path 34 are relatively short. This means that the operating conditions will be almost the same as when Vref and ILref were last updated. Thus, a relatively smooth transition in the power level of the transmitted signal can be achieved even when transitions are made between the power amplifier 32 path and the bypass path 34. In this situation, the temperature sensor may be dispensed with and only a single Vref and ILref value would be stored. The temperature sensor is useful in those embodiments where there may be significant changes in the temperature between each transition between the power amplifier 32 and the bypass path 34.

When the bypass path 34 is used, the power amplifier 32 can be switched off, thus increasing power efficiency. In one modification, the power amplifier 32 can have a different bias voltage applied thereto when the signal passes through the bypass path 34. By changing the biasing applied to the power amplifier 32 the operating characteristics of the amplifier 32 can be changed. The amplifier 32 may be biased so as to operate with a low power consumption. In other words, the biasing voltage may be applied to the amplifier 32 even though the signal is not passing through the amplifier 32. This has the advantage that the temperature variations in the amplifier 32 can be minimised whilst the amplifier 32 is bypassed. Thus, the temperature of the amplifier 32 will not be significantly altered for the duration when the signal passes through the bypass path 34.

In a preferred embodiment of the present invention, the look-up table stored in the control circuit 48 is updated each time a switch is made between the bypass switch 34 and the path through the power amplifier 32. Thus, during normal operation, the temperature behaviour is learnt by the embodiment of FIG. 3 to give optimum operation.

Embodiments of the invention may extend the gain control range thus reducing the need to provide other gain control blocks in the transmitter or in other circuits of the mobile station. Thus the first gain control block 13 may be omitted.

The operation of the second gain control block 26 of FIG. 3 has been discussed. It should be appreciated that the first gain control block may in association with a second power control amplifier with a bypass path be controlled in the same manner as the second gain control block 26, the power amplifier 32 and bypass path 34. The first gain control block would operate at the in the intermediate frequency range whilst the second gain control block 26 operates in the radio frequency. In another modification, the first gain control block 13, in addition to the second gain control block 26 or as an alternative to the second gain control block 26, can be used in the initialisation described herein before including assisting in the determining of the reference voltage Vref and the reference gain ILref and/or to control the gain of the signal applied to the power amplifier 32. The second gain control 26 may be omitted and the function thereof performed by the first gain control block 13.

Also, it should be noted the power control can be achieved in other ways. For example, power control can be done partly in a digital base band section which will be discussed hereinafter with reference to FIGS. 5 and 6.

In one modification to the embodiment shown in FIG. 3, a second higher coupling, coupler may be provided in series with the first coupler 38 and used when the power level of the transmitted signal is low. This will typically occur when output of the gain control block 26 is coupled to the bypass switch 34. When this occurs, a third switch will allow an output from the second coupler to also be input along with the output from the first coupler 38 to the RF to DC rectifier 44. The combined output of the first coupler 38 and the second coupler will generally be sufficient to provide a measurable value. The scaling required may be different from the situation where the first coupler 38 only is connected to the RF to DC rectifier 44. Thus, the scaling performed by the control circuit 48 may be dependent on the position of the third switch so as to take into account whether the RF to DC rectifier 44 receives an input from both the first and second couplers 38 or just from the first coupler 38. When the path through the power amplifier 32 is used, the output only of the first coupler 38 is used. The third switch will in those circumstances prevent the output of the second coupler from being input to the RF to DC rectifier 44. In another modification to the present invention, either the first coupler 38 or the second coupler, but not both couplers at the same time, will be connected to RF to DC rectifier 44. Coupler 38 may for example be used when the power amplifier 32 is used whilst the second coupler may be used when the bypass path 34 is used.

The coupler 38 can be replaced by any other suitable arrangement which is able to determine the power level of the output and provide a value to the control circuit 48. The additional coupler mentioned hereinbefore can be omitted or replaced by any other arrangement which is able to augment the signal provided by, for example, a single coupler. Examples of suitable arrangements for augmenting the output of a single coupler are shown in U.S. Pat. No. 5,392,464 (Nokia Mobile Phones) which is hereby incorporated by reference.

Although in the embodiments of the present invention described hereinbefore the gain control of the second gain control block 26 is set to a maximum value when switching between the bypass path 34 and the power amplifier path 34 occurs, it should be appreciated that switching between the two paths may be arranged to occur at any other value of gain control of the second gain control block 26 as is required. The value of gain control may also vary in response to the mode of operation of the transmitter.

Figure 4:
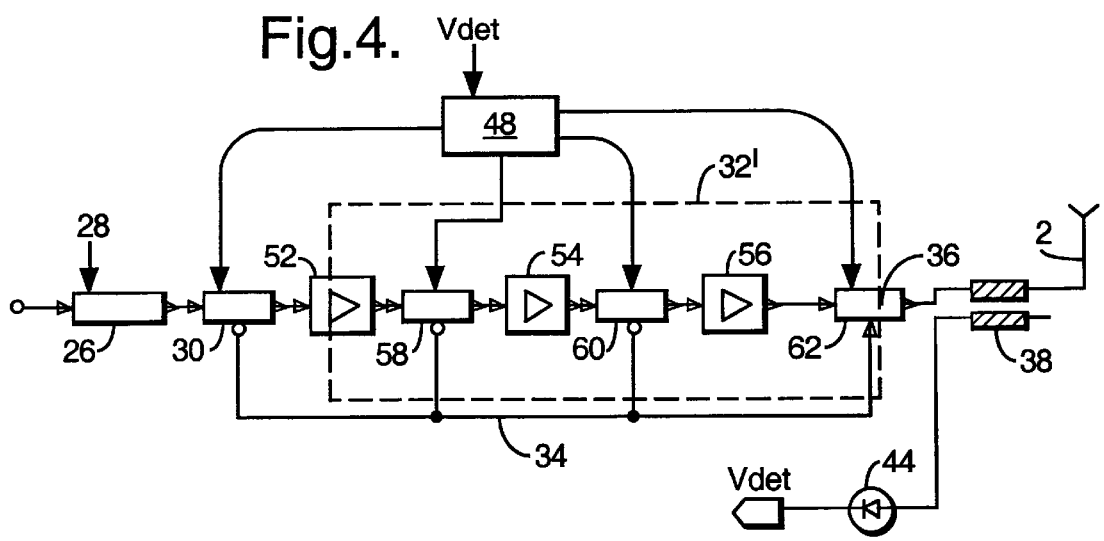
FIG. 4 shows a schematic view of a second transmitter embodying the present invention.

A second embodiment of the present invention will now be described with reference to FIG. 4. The arrangement in FIG. 4 is similar to that shown in FIG. 3. The same reference numerals are used in relation to FIG. 3 will also be used in FIG. 4 for the same items. For convenience, the parts of the transceiver upstream of the second gain control block 26 are not shown again in FIG. 4. The power amplifier 32 of FIG. 3 has been replaced in FIG. 4 by a power amplifier module 32'. The power amplifier module 32' comprises three power amplifiers 52, 54 and 56. A first further switch 58 is provided between the first and second amplifiers 52 and 54 and a second further switch 60 is provided between the second and third amplifiers 54 and 56. First and second switches 30 and 36, similar to those of FIG. 3, are provided at each end of the power amplifier module 32'. The arrangement shown in FIG. 4 shows the use of a single coupler 38. However, two couplers as discussed in relation to FIG. 3 could also be used with this embodiment.

Each of the further switches 58 and 60 receives a control signal from the control circuit 48. The control circuit 48, as with the embodiment shown in FIG. 3, controls the first and second switches 30 and 36, provides the control signal 28 to the second gain control block 26 and receives the output of the power detection RF to DC rectifier 44. When the desired power level of the signal to be transmitted (set by the control circuit 48) is in the first, lowest possible range of values, the output of the second gain control block 26 is directed by the first switch 30 to the bypass path 34. The further switches 58 and 60 are positioned so that none of the signals directed by the first switch 30 through the bypass path 34 passes through any of the power amplifiers of the power amplifier module 32'. The second switch 36 is controlled to connect the bypass path 34 to the coupler 38.

When the desired power level of the signal to be transmitted falls into the second, next lowest range of power values, the first switch 30 is controlled to allow the output of the second gain control block 26 to pass through the first power amplifier 52. However, the first further switch 58 is controlled to connect the output of the first power amplifier 52 to the bypass path 34 so that the output of the second gain control block 26 only passes through one power amplifier.

If the desired power level falls into the third range of power values, which are higher than the second range of power values, the output of the second gain control block 26 passes through the first switch 30 to the first power amplifier 52, through the first further switch 58 to the second power amplifier 54 and through the second further switch 60 to the bypass path 34. In other words, the third power amplifier 56 is bypassed.

Finally, if the desired power level falls in the fourth, highest range of power values, the output of the second gain control block 26 will pass through the first switch 30, the first power amplifier 52, the first further switch 58, the second power amplifier 54, the second further switch 60 and the third power amplifier 56.

The control circuit 48 controls the gain of the second gain control block 26 and the switches 30,58,60,36 associated with the power amplifier module 32' in the same manner as in the embodiment shown in FIG. 3. However, three different reference gain values ILref and reference voltage values Vref will be stored. For example, initially the second gain control block will be controlled to have its maximum gain and the signal will only pass through the first amplifier 52. The output of the RF to DC rectifier 44 will be stored as Vref1 by the control circuit 48. Next, the signal will be fed through two of the three amplifiers i.e. the first and second amplifiers 52 and 54. The gain of the gain control block will be decreased until the output of the RF to DC rectifier 44 is the same as Vref1. This gain value will be stored as ILref1. The values of Vref and ILref will be used for transitions between the signal passing just through the first amplifier 52 and the signal passing through the first and second amplifiers 52 and 54. Likewise, reference values Vref0 and IL0 will be stored based on the situation where the signal first passes only through the bypass chain 34 and then passes through the first amplifier 52 only. Values Vref2 and ILref2 will be stored when the signal passes first through only the first and second amplifiers 52 and 54 and then through all three amplifiers 52, 54 and 56. In the same manner as described in relation to the first embodiment, smooth transitions between adjacent power ranges can be achieved.

As with the previous embodiment, a temperature sensor can also be included to compensate for variations in temperature.

In this arrangement, the power amplifier module 32' is shown as having three amplifiers. It should be appreciated that any suitable number of amplifiers can be used. For example, two amplifiers can be used or more than three amplifiers can be used.

A third embodiment of the present invention will now be described with reference to FIG. 5. The same reference numerals as used in FIGS. 3 and 4 will be used for the same items in FIG. 5. Those items of FIG. 5 which are the same as items of FIGS. 3 and/or 4 will not be described again.

Figure 5A:
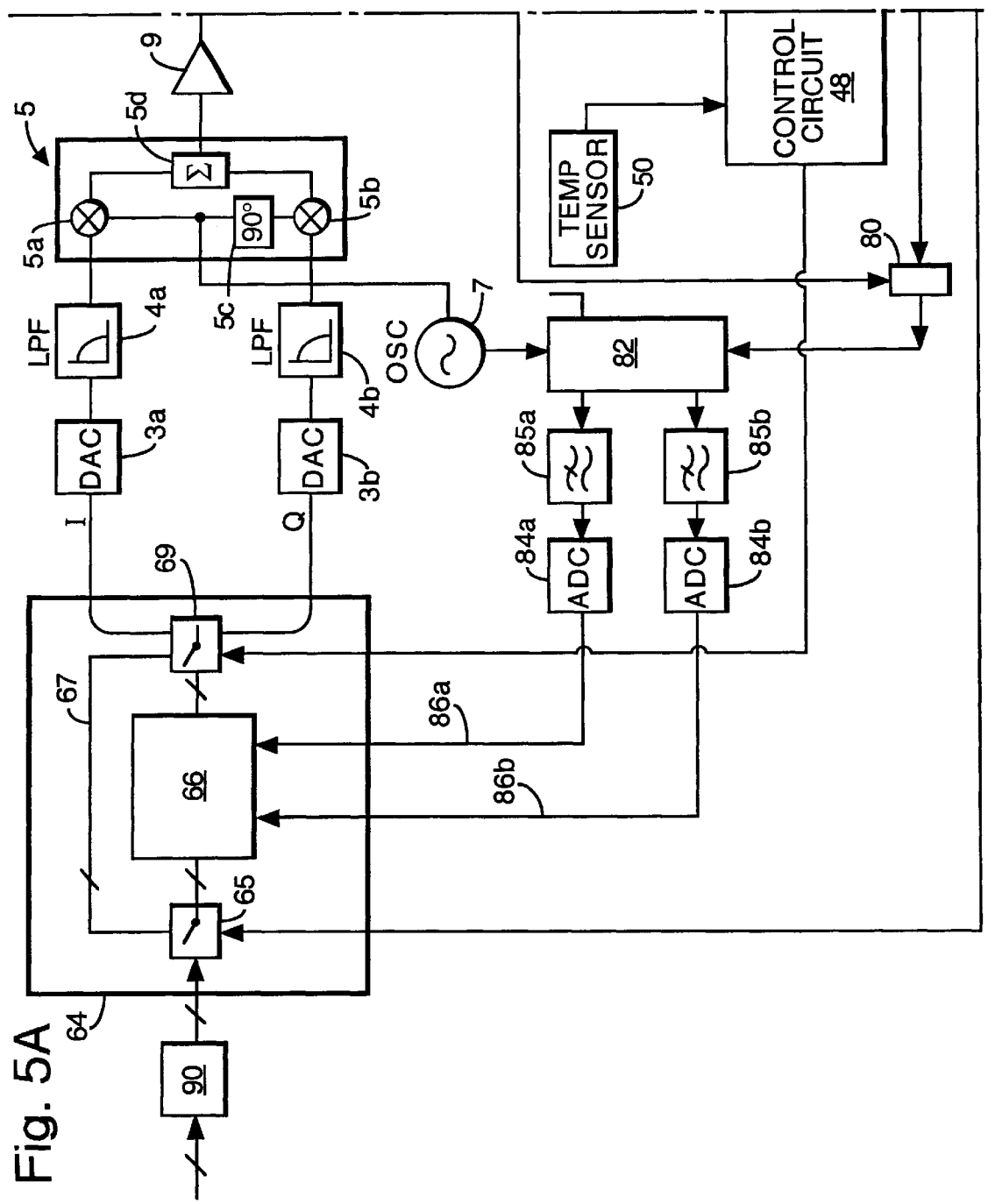
FIG. 5 shows a schematic view of a third transmitter embodying the present invention.
Figure 5B:
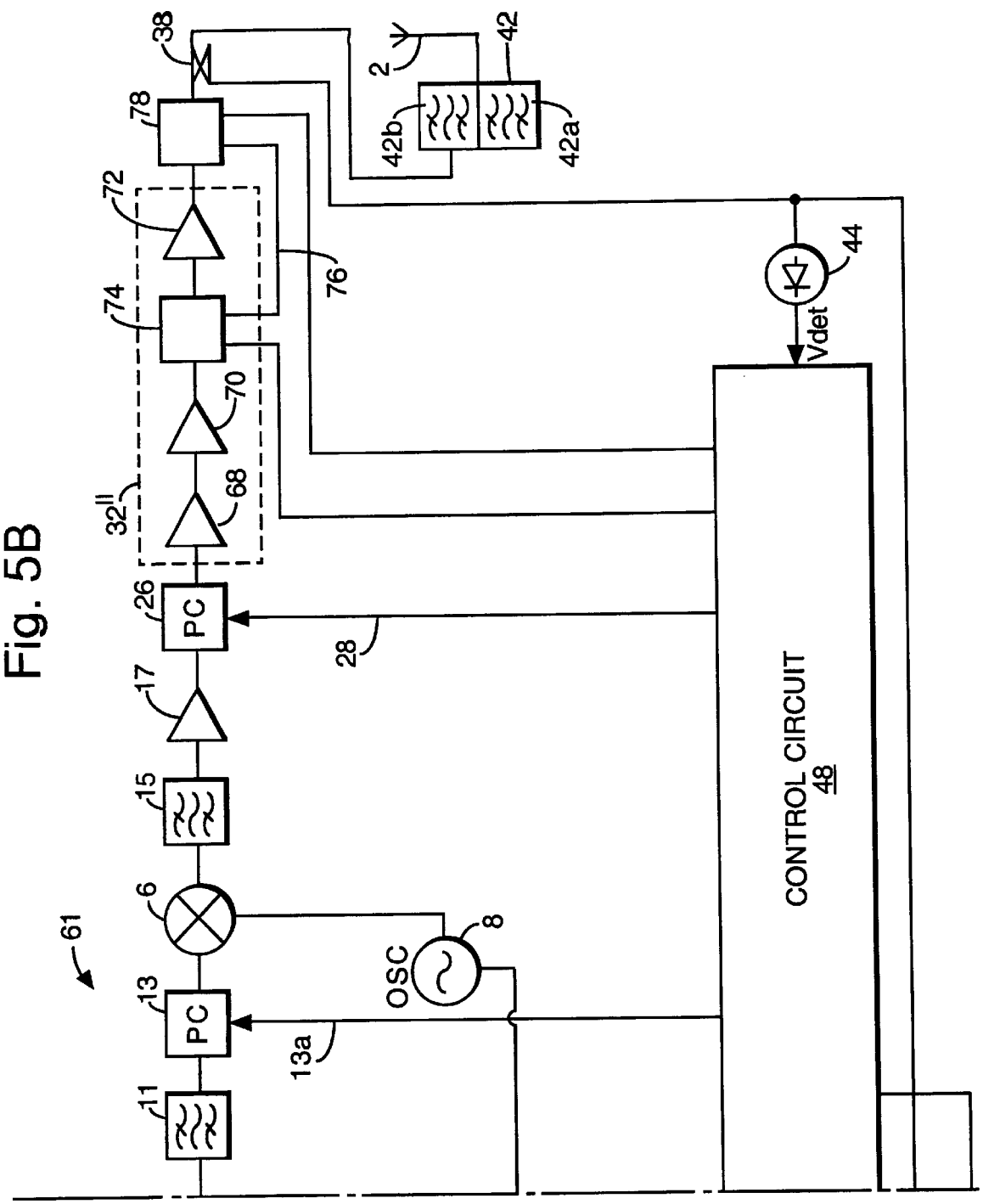

FIG. 5 shows a transmitter 61 with a digital predistortion means for linearising the response of a power amplifier module 32" and a bypass path 76, similar to the bypass path of FIGS. 3 and 4. The complex input signal is input to a digital power control block 90, the complex output signal of which is input to a digital predistortion circuit 64. The digital signal having I and Q components is input to a predistorter 66 of the predistortion circuit 64 which predistorts the digital complex signal to provide a predistorted complex signal with I and Q components. The distortion applied by the predistorter 66 is opposite to the distortion caused by the non-linearity of the power amplifier module 32". Thus when the signal distorted by the predistorter 66 is input to the power amplifier module 32", the output of the power amplifier module is linear as compared to the digital signal prior to being input to the distorter 66.

The predistorted I and Q components are output by the predistorter 66 and input to respective digital to analogue (D/A) converters 3a and 3b. The components between the digital to analogue convertors 3a and 3b are at the power amplifier module 32" are the same as in FIG. 3 and will not be described again. For convenience the complex signal path through the predistortion circuit is represented by a single line. However, it should be appreciated that in practice there will be separate I and Q paths.

The power amplifier module 32" comprises three amplifiers 68, 70 and 72. The power module 32" may be replaced by power module 32' shown in FIG. 4 or the power amplifier 32 shown in FIG. 3. In the power amplifier module 32" shown in FIG. 5, a first switch 74 is provided between the second and third amplifiers 70 and 72. The second switch 78 is arranged at the output of the power amplifier module 32". A bypass path 76 is provided to bypass only the third amplifier 72. Accordingly, with the power amplifier module 32" shown in FIG. 5, the output of the gain control block 26 is arranged either to pass through all three amplifiers 68, 70 and 72 or to pass through the first two amplifiers 68 and 70 and then bypass via bypass path 76 the third amplifier 72. The first and second switches 74 and 78 control the bypass path 76 in a manner similar to the switches 30 and 36 of FIG. 3 and are controlled by control circuit 48.

A coupler 38 is arranged to provide two outputs both of which have a power level which is much less than the power level of the signal to be transmitted. The first output of the coupler 38 is to the RF to DC rectifier 44 and as with the embodiments of FIGS. 3 and 4, provides a measure of the power level of the transmitted signal. The second output from the coupler 38 is input to a third mixer 80. The third mixer 80 also receives an input from the second local oscillator 8. The output of the third mixer 80 represents the signal, which is transmitted, but at the intermediate frequency instead of the radio frequency. The output of the third mixer 80 is input to an IQ demodulator 82 which also receives an input from the first local oscillator. The output of the demodulator 82 is therefore at the baseband frequency and includes an I component and a Q component. The output of the demodulator 82 is connected to respective analogue to digital (A/D) converters 84a and b via respective low pass filters 85a and 85b. The output of the analogue to digital converters 84a and b are input to the predistorter 66. The paths from the output of the analogue to the digital converters 84a and b to the predistorter 66 are referred to as the adaption paths 86a and b. The predistorter 66 is arranged to compare the signals which are input to the predistorter with the signals which are actually transmitted and which the predistorter 66 has received via the adaption paths 86a and b. The predistorter 66 compares these signals which ideally should be the same. Based on the comparison, the predistorter 66 calculates corrected predistortion co-efficients which are to be applied to the next digital signals to be output from the predistorter 66 so that the transmitted signals and signals to be input to predistorter 66 are as similar as possible. If the signal to be transmitted is the same or similar to the transmitted signal it can be assumed that the predistortion applied by the predistorter 66 has provided good compensation for the non-linearity of the power amplifier module 32".

The non-linearity characteristics of the amplifier module 32" may change with temperature. Accordingly, the predistortion applied by the predistorter 66 may be continuously modified with the help of adaption path comparisons, taking into account the changes caused by, for example, changes in temperature.

When the transmitted power level decreases so that the bypass path 76 is used, the predistorter 66 is switched off or bypassed. The position of switches 65 and 69 are controlled by the control circuit 48 to prevent the signal passing through the predistorter 66. A second bypass path 67 having one path for the I component and one path for the Q component will instead be used for the input signal. Thus, the input signal will either pass through the predistorter 66 is the required power level for the transmitted signal is relatively high or through the second bypass path 67 if the required power level for the transmitted signal is relatively low. The switches 65 and 69 are controlled by the control block 48. The third amplifier 72 will be bypassed if the second bypass path 67 for the input signal is used. As the third amplifier 72 is bypassed, the signal in the adjacent channels caused by the spectrum spreading is low due to the low power level. Thus, the power consumed by the predistorter 66 can be saved at lower power levels by switching off that predistorter. However, at higher levels where spectrum spreading to adjacent channels would be a more significant problem, the digital predistorter 66 can be used.

Typically each of the three amplifiers 68, 70 and 72 will provide the same amplification. Thus, if the amplification factor for each amplifier is ten, the first amplifier 68 will amplify the signal input to the amplifier module 32" by a factor of ten. This means that the output of a second amplifier 70 will be ten x ten as large as the input to the power amplifier module 32". The output of the third amplifier is thus ten x ten x ten as large as the input to the power amplifier module 32". All three amplifiers 68, 70 and 72 are used if a relatively high power level is required for the transmitted signal or the third power amplifier 72 is bypassed if the power required is relatively low. As the output power provided by the third amplifier is the greatest, it is the non-linearity of the third amplifier 72 which will cause most problems with spectrum spreading to adjacent channels. Therefore, it is desirable that whenever the third amplifier 72 is used, predistortion also be used. With the first and second amplifiers 68 and 70, the power level of the output of these amplifiers is relatively low so that spectrum spreading to adjacent channels is also relatively low. If spectrum spreading does occur, at the lower power levels, it is unlikely to give rise to significant levels of interference. Accordingly, the digital predistortion circuit 64 can be switched off thus saving power.

If the power amplifier module 32" is replaced by that of FIG. 4, the predistorter 66 will be switched off when the desired power level falls below a given level. This could be when all of the amplifiers are bypassed, when two of the amplifiers are bypassed or even when one of the three amplifiers is bypassed.

The switching between the bypass path 76 and the path through the third amplifier 74 can be controlled in the same way as described in relation to the first and second embodiments. In one modification to the embodiment shown in FIG. 5, the predistortion circuit 66 is only switched off when the bypass path 76 is used and the gain of the second gain control circuit 26 has fallen below a given level.

A modification to the embodiment shown in FIG. 5 will now be described with reference to FIG. 6.

Those items which are the same as those shown in FIG. 5 have been marked with the same reference numerals. Additionally, those items which are the same as those of FIG. 5 will not be described again. The power amplifier module 32''' of FIG. 6 comprises three amplifiers 88, 90 and 92. A bypass path 34 for the power amplifier module 32''' is provided. This bypass path 34 is similar to that shown in FIG. 3. Accordingly, when the power level of the signal to be transmitted is below a certain level, the first and second switches 30 and 36 are controlled, in the same way as described in relation to FIG. 3, by the control circuit 48 to cause the output of the second gain control block 26 to be output via the bypass path 34. Switching between the bypass path 34 and the power amplifier module 32''' occurs in the same manner as disclosed in relation to FIG. 3.

Bias control circuitry 94 controlled by the control circuit 48 is now provided. The output of the bias control circuitry 94 provided a control signal 95 to the third amplifier 92 which provides the most significant power level of the signal from the second gain control block 26. The reasons for this have been discussed hereinbefore with reference to FIG. 5. The bias control block 94 is included in the predistortion circuit 64. As with the embodiment shown in FIG. 5, when the desired output power level falls below a given level the predistorter 66 will be bypassed. When the predistorter 66 is bypassed, the bias control circuit 94 changes the bias voltage applied to the amplifier. This changes the operating characteristics of the amplifier 92 and for example may make its operation more linear. For example, the amplifier may operate as a B class amplifier when predistortion is provided and as an AB class amplifier when no predistortion is provided. When the predistorter 66 is used, the bias voltage applied by the bias control circuit 94 causes the third amplifier 92 to operate non-linearly which is its most power efficient mode of operation. When the predistorter 66 is bypassed, the bias voltage applied by the bias control circuit 94 is such that the third amplifier operates linearly. This represents a power saving, at lower power levels as compared to the case where the third amplifier 94 operates more efficiently in a nonlinear manner but with the predistortion circuit 64 switched on.

When the bypass path 34 is used, the digital predistorter 66 will be bypassed. When the required output power is above a certain level, the output of the gain control block 26 will pass through the power amplifier module 32'''. If the power level is below a certain level, but above the level which would cause switching to the bypass path 34, the digital predistortion circuit 64 will be switched off and a suitable bias current applied to the third amplifier to cause that amplifier to operate linearly or more linearly.

Figure 6A:
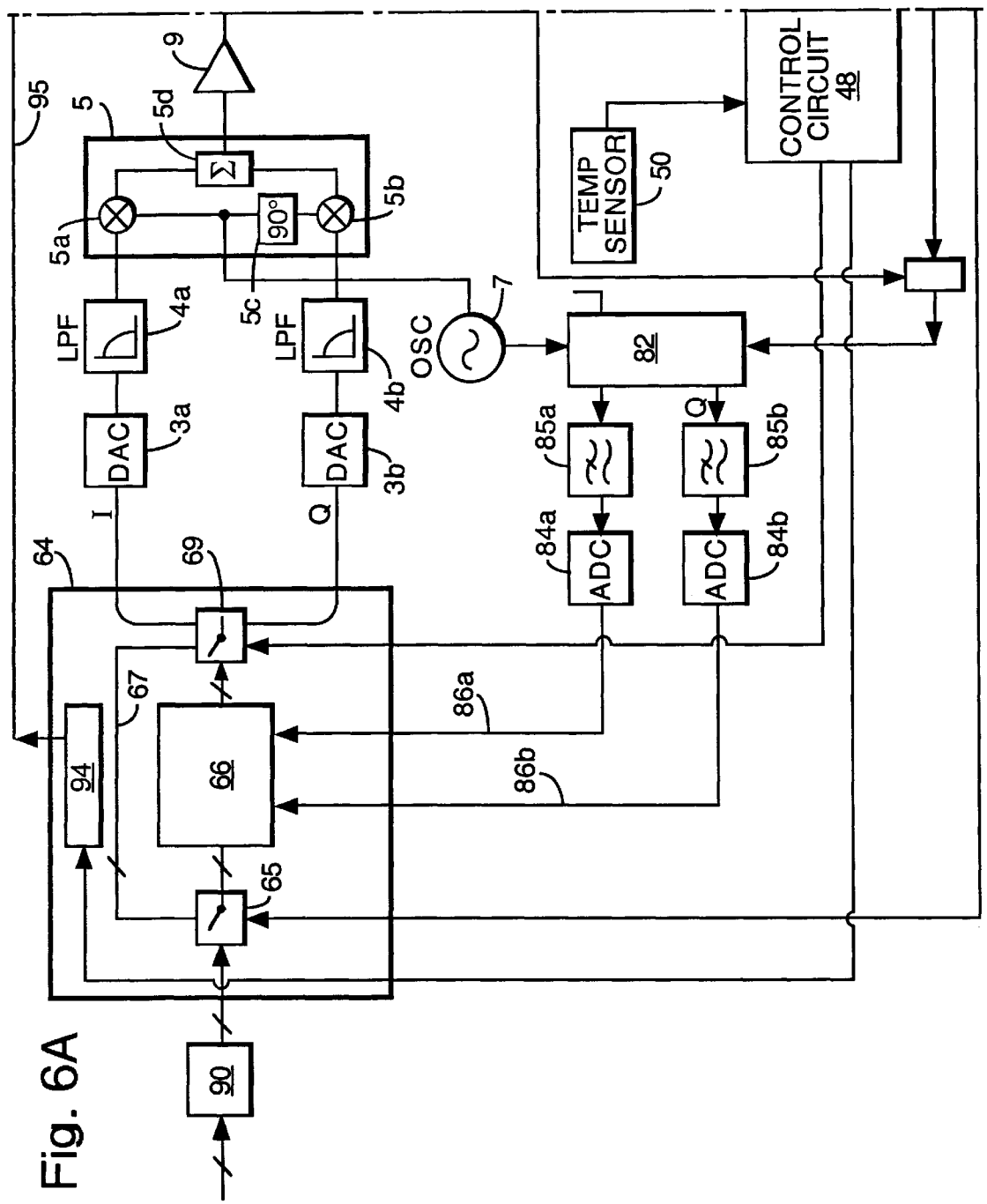
FIG. 6 shows a schematic view of a fourth transmitter embodying the present invention.
Figure 6B:
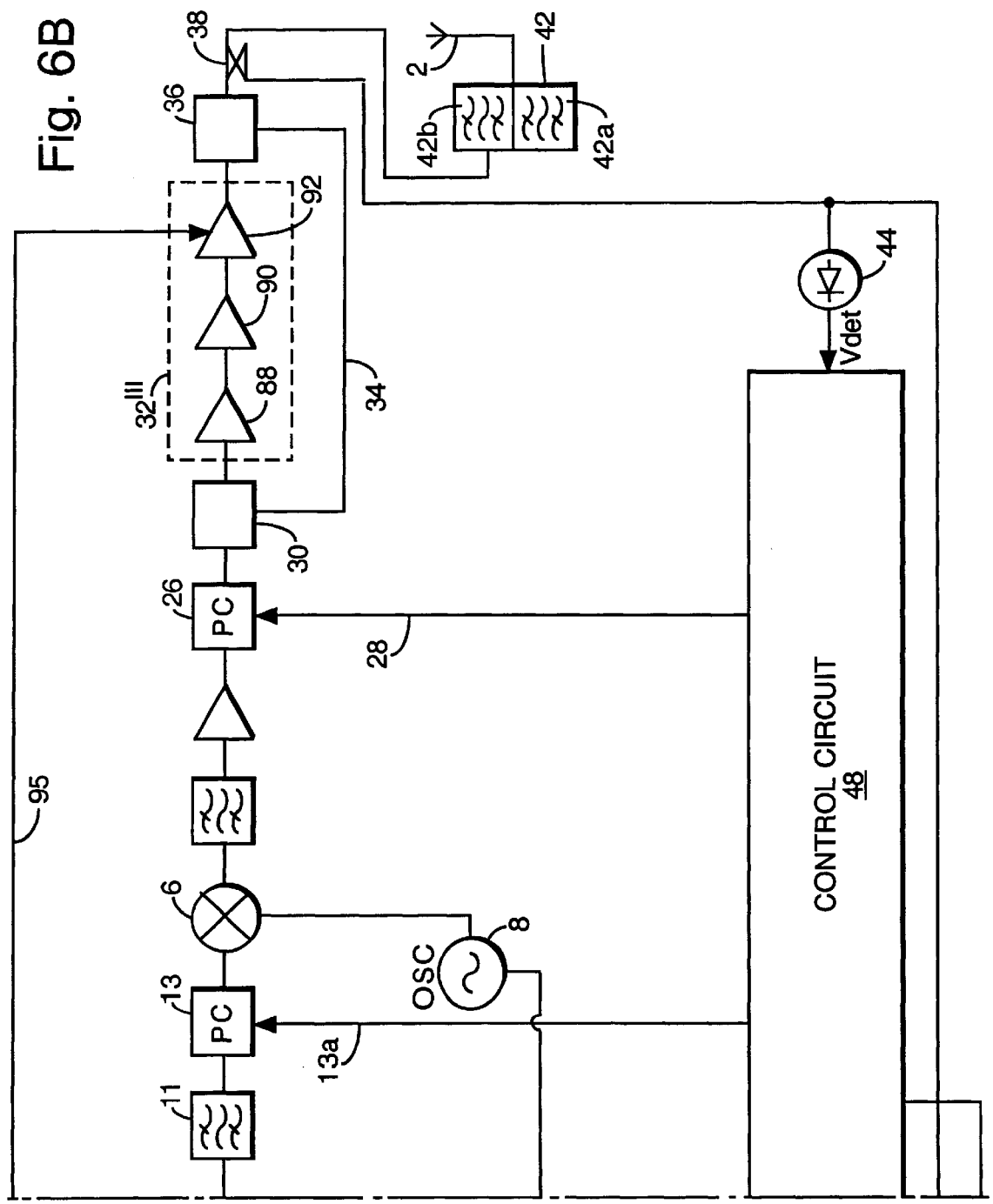

It should be appreciated that the embodiment shown in FIG. 6 can be modified so that the bias control signal is applied to one, two or three of the amplifiers of the power amplifier module.

If the bias voltage applied to an amplifier is changed, the gain of the amplifier may be altered. The gain change should be taken into account by, for example, adding a correction value to the current gain of the second gain control block 26. The correction value may be preprogrammed into a memory of the control circuit 48. Alternatively, the control circuit 48 may be arranged so as to learn what correction value is to be applied when the bias voltage is first changed. The correction value may be altered in accordance with changes in temperature. In some embodiments of the invention, the correction value applied will depend on the temperature. The control circuit 48 may be arranged to "learn" how the correction value varies with temperature and thus store a look-up table providing a correlation between the temperature and the correction value.

In one modification to the embodiment shown in FIG. 6, the bias control circuit 94 is not present. In this modification, the predistorter 66 is not only used when the signal from the gain control block passes through the power amplifier module 32'''. The predistorter 66 is bypassed when the signal from the gain control block passes through the bypass path 34 for the power amplifier module 32'''.

It should be noted that the bypass path, when provided, will generally have a stable gain even with changes in temperature. However, the gain of the power amplifiers may change with temperature.

It should be appreciated that in all of the illustrated embodiments it may be required to introduce an amount of hysteresis to the reference values at which switching of the power level of transmitted signal occurs. If no hysteresis were present a situation may occur where when the desired power level continuously varied between a value slightly below the switching reference value and a value slightly above the switching reference value, the transmitted signal would be constantly switched from a high gain path to a low gain path and back again. This might be undesirable since switching might cause sudden phase changes to the transmitted signal. The provision of a hysteresis range about the reference valve would avoid this undesirable situation arising. The hysteresis range can vary according to the type of operation. For example a speech terminal might have different hysteresis range than a speech and data terminal.

In all of the illustrated embodiments the gain provided by the respective gain control blocks may be positive or negative.

In all of the embodiments described hereinbefore it may be desirable to decide the transmission path before actual transmission is started. This is because when the transmission path of the transmitted signal is switched, a phase change in the signal occurs and it has been found that some of the receivers used in CDMA systems that embodiments of the present invention are to be used in suffer a loss in performance if a sudden phase change in the transmitted signal occurs. This loss in performance occurs because in such CDMA systems it is likely that the base station averages the phase of the input signal for a period longer than a power control period in order to achieve better performance (it is known that phase averaging improves performance especially in slowly fading channels). Typically, in such a CDMA base station, the signal phase is averaged over 2–5 power control periods. If, as in the embodiments illustrated hereinbefore, the determination of the desired power level and hence the required transmission path occurs on a slot-by-slot basis, a significant performance loss may occur in the base station receiver, especially if the transmission path bypassing is occurring at substantially the power level of a particular actual transmission such that the transmission path switches between the first path and second path repeatedly during the transmission. However, if the transmission path is switched only once during a signal transmission, the loss in performance for a speech transmission remains acceptable. The transmission of power control command included within the transmission signal must be performed before the next payload field within a slot. This may also be the best time to switch between the transmission paths without effecting the measurement of the signal to interference ratio at the base station.

Figure 7:
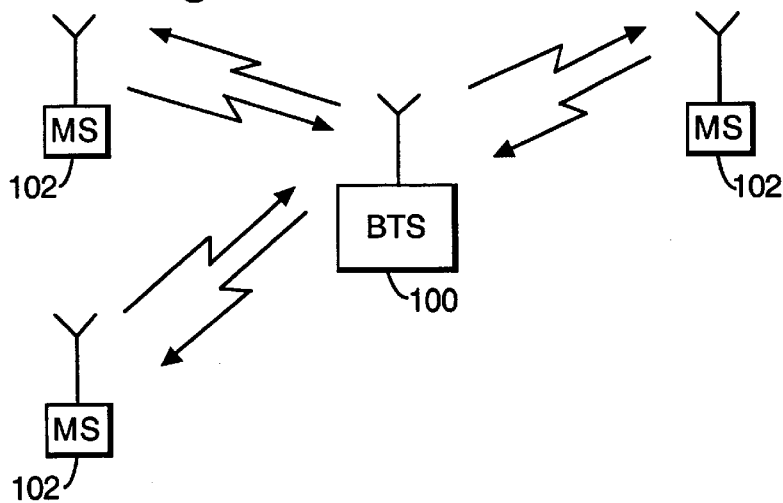
FIG. 7 shows a typical cellular network in which embodiments of the present invention can be used.

FIG. 7 shows part of a cellular communication network in which the transmitter shown in FIGS. 3 to 6 can be used. Cellular telecommunication networks typically comprise a network of base stations 100, one of which is shown in FIG. 7. Each base station 100 is arranged to transmit signals to and receive signals from mobile stations 102. Generally, radio waves are used in the communications between the base stations 100 and the mobile stations 102.

Preferred embodiments of the present invention are incorporated in the mobile stations which are generally battery powered and as such power efficiency is of importance. However, embodiments of the present invention may be incorporated in any suitable radio frequency communication device. Embodiment of the present invention may be incorporated in a base transceiver station. Embodiments of the present invention are particularly suitable for use in spread spectrum communications and, in particular, code division multiple access systems. However, embodiments of the present invention may also be included in other cellular telecommunication networks such as those using frequency division multiple access, time division multiple access and/or space division multiple access. Embodiments of the invention are particular applicable to arrangements which require high power control and accuracy and high power control dynamic range such as certain CDMA systems. However it should be emphasised that embodiments of the present invention are not limited to spread spectrum systems.

Figure 8A:
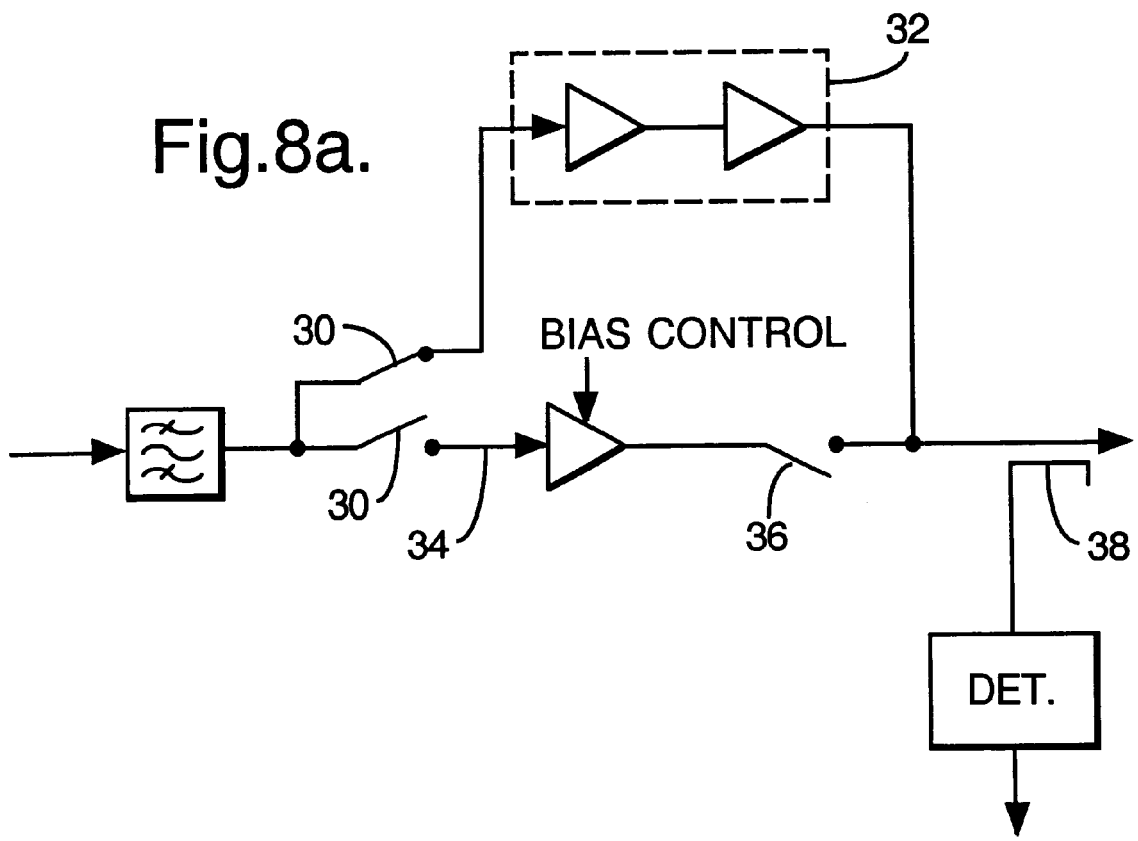
FIG. 8a shows a further embodiment of the present invention suitable for speech and data transmission.
Figure 8B:
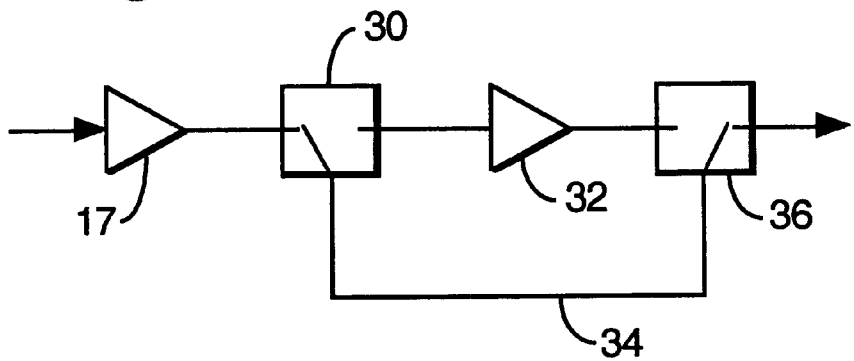
FIG. 8b shows another further embodiment of the present invention which is suitable for speech and data transmission; and Note that all Figures before FIG. 8 can be understood as speech only cases (or data only cases)

FIGS. 8a–8b show further embodiments of the present invention, with those components common to the embodiment shown in FIG. 3 labelled with the same reference numerals. FIGS. 8a and 8b show embodiments of the present invention suitable for the transmission of speech and data, wherein data transmission at 144 kbps is transmitted via paths 32. The transmission path is decided before transmission is started in order to optimise the power consumption of the transmitter and to avoid sudden phase changes in transmitted signal. During transmission the transmission path may be switched, but certain rules may need to be followed. Those rules can be summarised as follows:

1. When transmission is started with a speech only signal, transmission path 34 is selected i.e. transmission occurs at a relatively low power level.
2. If during a speech only transmission it is noticed that a higher transmission power level is required, transmission is switched to transmission path 32.
3. If during a transmission started with a speech only signal, it is required to also transmit a data signal, then a transmission path is switched to transmission path 32, i.e. transmission at a relatively high power level. It should be noted that the transmission path switching should occur just before the data transmission begins.
4. If transmission is started with a data signal, and then transmission path 32, i.e. at a relatively high power level, is selected, independently of the initial required power level.
5. If during a transmission of data signals, the data transmission is ended and transmission continues with a speech only signal, then the transmission path is switched from path 32 to path 34, the switching occurring only after the data transmission has ended.
6. If the transmission signal is known to always be a packed data transmission, a transmission path 32, i.e. at a higher power level, is selected. It should be noted that transmission path 34 may be selected when no data packets are transmitted but only a lower bit rate control channel is transmitted at the lower power level path.

Embodiments of the invention may be arranged to use direct conversion where the signals are directly converted from the baseband frequency to the radio frequency and not via an intermediate frequency. It is also possible to use more than one intermediate frequency in the transmitter.

What is claimed is:

1. A transmitter comprising:

an input for receiving a signal;

gain control means for applying a first gain to the received signal;

first path means for providing a second, relatively high gain for said received signal;

second path means for providing a third, relatively low gain for said received signal;

transmitter means for transmitting a signal; and control means operable, in use, to cause a received signal to pass through the gain control means and said first path means when a relatively high gain is to be applied to the received signal and to cause a received signal to pass through the gain control means and said second path means when a relatively low gain is to be applied to said received signal, wherein when a change is made from using one of said first and second path means to using the other of said first and second path means, the power of the signal transmitted by the transmitter varies by less than or equal to a predetermined amount;

and measuring means to provide a value indicative of the value of the power level of the signal transmitted by the transmitter means, said measuring means providing a reference value when a signal passes through said second path means and the gain of the gain control means has been set to a predetermined level, wherein the control means, when the measuring means provides the reference value when a signal passes through the first path means, causes a received signal to pass through said second path means.

2. A transmitter as claimed in claim 1, wherein the gain of the gain control means is variable.

3. A transmitter as claimed in claim 1, wherein said control means is arranged to ensure that the proper of the signal transmitted by the transmitter means remains substantially the same when a change is made between said first and second paths.

4. A transmitter as claimed in claim 1, wherein said predetermined gain level in the maximum gain of the gain control means.

5. A transmitter as claimed in claim 4, wherein said maximum gain of the gain control means varies in response to the mode of operation of the transmitter.

6. A transmitter as claimed in claim 1, wherein said predetermined gain level varies in response to the mode of operation of the transmitter.

7. A transmitter as claimed in claim 1, wherein the transmission path is selected prior to transmission, dependent on the mode of operation.

8. A transmitter as claimed in claim 1, wherein when the change is made so that a received signal passes through the second path means, the gain of the gain control means is set to the predetermined gain level.

9. A transmission as claimed in claim 1, wherein when the measuring means provides a predetermined value, when a received signal passes through said second path means, the control means causes a received signal to pass through said first path means.

10. A transmitter as claimed in claim 9, wherein, when a signal passes through said first path means and the measuring means provides the predetermined value, the corresponding gain value defines a reference gain value.

11. A transmitter as claimed in claim 10 wherein, the gain of said gain control means is set at the reference gain value when the control means causes a received signal to change to the first path means.

12. A transmitter as claimed in claim 9, wherein said predetermined value of said measuring means is the same as the reference value of the measuring means.

13. A transmitter as claimed in claim 8, wherein when the control means subsequently causes the change from the first path means to the second path means, the gain value of the gain control means which causes a received signal passing through the first path means to provide the predetermined value at the measuring means is stored as a new reference gain value.

14. A transmitter as claimed in claim 1, wherein when the control means subsequently causes the change from the second path means to the first path means, the value of the measuring means causes by a received signal passing through the second path means when the gain of the gain control means is at the predetermined level is stored as a new reference value.

15. A transmitter as claimed in claim 10, wherein a temperature sensor is provided and the control means is arranged to compensate the reference gain value for variations in temperature.

16. A transmitter as claimed in claim 1, where a temperature sensor is provided and the control means is arranged to compensate the reference value of the measuring means for variations in temperature.

17. A transmitter as claimed in claim 1, wherein the gain of the first and/or second path means is substantially constant.

18. A transmitter as claimed in claim 1, wherein the power level of the signal transmitter by the transmitter means is increased or decreased by said predetermined amount when changing between the first and second path means.

19. A transmitter as claimed in claim 1, wherein said first path means comprises amplifier means.

20. A transmitter as claimed in claim 19, comprising predistortion means for predistorting the received signal prior to the signal passing through said amplifier means, whereby said predistortion means is arranged substantially to compensate for non-linearity of said amplifier means, the control means arranged if the power level of the signal to be transmitted by the transmitter means is below a predetermined level, the signal does not pass through said predistortion means and if the power level of the signal to be transmitted by the transmitter means is above a predetermined level said received signal passes through said predistortion means and said amplifier means.

21. A radio frequency transmitter as claimed in claim 20, wherein bias control means are provided for controlling the biasing applied to said amplifier means, whereby if the power level of the signal to be transmitted by the transmitted means is above the predetermined level, then the amplifier means is controlled by the bias control means to operate non-linearly.

22. A radio frequency transmitter as claimed in claim 21, wherein when a power level of a signal transmitted by said transmitter is below the predetermined level, the amplifier means is controlled by the bias control means to operate substantially linearly.

23. A transmitter as claimed in claim 1, wherein said first path comprises:
   a plurality of amplifiers arranged in series; and
   said second path bypasses at least one of said plurality of amplifiers.

24. A transmitter as claimed in claim 1, wherein said reference values comprise a range of values whereby when switching occurs between power levels hysteresis occurs.

25. A transmitter as claimed in claim 24, wherein said range of values may vary depending on the terminal operation mode.

26. A transmitter as claimed in claim 1, wherein said transmitted signal comprises speech signals or data signals or a combination of speech and data signals.

27. A transmitter as claimed in claim 24, wherein when said transmitted signal comprises speech signals the power level of said transmitted signal is relatively low.

28. A transmitter as claimed in claim 26, wherein when said transmitted signal comprises data signals or a combination of speech and data signals the power level of said transmitted signal is relatively high.

29. A transmitter as claimed in claim 1, when incorporated in a mobile station.

30. A method for controlling gain of a transmitted signal comprising the steps of:

receiving an input signal;

applying a first gain to the input signal;

causing a received signal to pass through a first path providing a second, relatively high gain when a relatively high gain signal is required and causing a received signal to pass through second path means providing a third, relatively low gain when a relatively low gain is required;

providing a value indicative of the value of the power level of the signal transmitted;

providing a reference value when a signal passes through the second path means and the first gain has been set to a predetermined level; and controlling the gain applied to the input signal so that when a change is made using one of the first and second paths to using the other of said first and second paths, the power of the transmitted signal varies by less than or equal to a predetermined amount, wherein when the reference value is provided when the signal passes through the first path means, the signal is caused to pass through the second path means.

* * * * *

UNITED STATES PATENT AND TRADEMARK OFFICE
CERTIFICATE OF CORRECTION

PATENT NO.    : 6,563,883 B1                                            Page 1 of 1
DATED         : May 13, 2003
INVENTOR(S)   : Leinonen et al.

It is certified that error appears in the above-identified patent and that said Letters Patent is hereby corrected as shown below:

Column 19,
Line 44, "proper" should read -- power --.
Line 49, "in" should read -- is --.
Line 64, "transmission" should read -- transmitter --.

Column 20,
Line 24, "causes" should read -- caused --.
Line 40, "transmitter" should read -- transmitted --.
Line 60, "transmitted" should read -- transmitter --.

Column 21,
Line 15, "claim 24" should read -- claim 26 --.

Signed and Sealed this

Twenty-third Day of September, 2003

JAMES E. ROGAN
*Director of the United States Patent and Trademark Office*